US007076071B2

(12) United States Patent
Katz

(10) Patent No.: US 7,076,071 B2
(45) Date of Patent: Jul. 11, 2006

(54) PROCESS FOR ENHANCING THE EXISTING AMBIENCE, IMAGING, DEPTH, CLARITY AND SPACIOUSNESS OF SOUND RECORDINGS

(75) Inventor: Robert A. Katz, 1456 Northridge Dr., Longwood, FL (US) 32750

(73) Assignee: Robert A. Katz, Longwood, FL (US)

( * ) Notice: Subject to any disclaimer, the term of this patent is extended or adjusted under 35 U.S.C. 154(b) by 768 days.

(21) Appl. No.: 09/877,158

(22) Filed: Jun. 8, 2001

(65) Prior Publication Data

US 2002/0015505 A1 Feb. 7, 2002

Related U.S. Application Data

(60) Provisional application No. 60/210,976, filed on Jun. 12, 2000.

(51) Int. Cl.
*H04R 5/02* (2006.01)
*H04R 5/00* (2006.01)
*H03G 3/00* (2006.01)

(52) U.S. Cl. ............................ 381/307; 381/1; 381/18; 381/63

(58) Field of Classification Search ................ 381/307, 381/1, 18, 63
See application file for complete search history.

(56) References Cited

U.S. PATENT DOCUMENTS

| | | | |
|---|---|---|---|
| 3,249,696 A | 5/1966 | Van Sickle | |
| 3,670,106 A | 6/1972 | Orban | |
| 3,697,692 A | 10/1972 | Hafler | |
| 3,772,479 A | 11/1973 | Hilbert | |
| 3,849,600 A | 11/1974 | Ohshima | |
| 4,237,343 A * | 12/1980 | Kurtin et al. | 381/63 |
| 4,283,600 A | 8/1981 | Cohen | |
| 4,359,605 A | 11/1982 | Haramoto et al. | |
| 4,841,572 A | 6/1989 | Klayman | |
| 5,412,731 A | 5/1995 | Desper | |
| 5,524,054 A * | 6/1996 | Spille | 381/18 |
| 5,677,957 A | 10/1997 | Hulsebus | |
| 5,896,456 A | 4/1999 | Desper | |
| 5,970,152 A | 10/1999 | Klayman | |
| 6,002,776 A | 12/1999 | Bhadkamkar et al. | |

OTHER PUBLICATIONS

Schroeder, Manfred R., "An Artificial Stereophonic Effect Obtained from a Single Audio Signal", *Journal of the Audio Engineering Society*, Apr. 1958, vol. 6, #2, pp. 74-79.

(Continued)

*Primary Examiner*—Huyen Le
*Assistant Examiner*—Devona E. Faulk

(57) ABSTRACT

A process for enhancing ambience in an audio signal output that is derived from an audio signal input in a dual channel audio ambience extraction circuit. The process includes cross-coupling of audio signals in one channel with audio signals in another channel. Each of the cross-coupled signals is attenuated and delayed by an adjustable time period that is within a haas delay time and is then applied in the feedback path to a summing input of an opposite channel. At the summing input, the signals are mixed with subsequent audio signal inputs to that channel. All of the attenuated and delayed signals are continuously applied to outputs of the extraction circuit during the cross-coupling process. The output signals comprise the original signals plus delayed and attenuated reproductions of the original signal along with continuing signals that are submitted to the extraction circuit subsequent to the initial signals.

8 Claims, 4 Drawing Sheets

OTHER PUBLICATIONS

Bauer, B.B., "Some Techniques Toward Better Stereophonic Perspective", *IEEE Transactions on Audio*, AU-11, 88, p. 88-92.

Orban, Robert, "A Rational Technique for Synthesizing Pseudo-Stereo From Monophonic Sources", *Journal of the Audio Engineering Society*, Apr. 1970, vol. 18, #2, p. 157-164.

Madsen, E. Roerbaek, "Extraction of Ambiance Information from Ordinary Recordings", *Journal of the Audio Engineering Society*, Oct. 1970, vol. 18, #5 p. 490-497.

* cited by examiner 31A 32A 33A 34A $$CHA\_OUT = CHA\_SOURCE + [K_1 * (CHB\_SOURCE_{delayed\_by\_D1})] - [K_2 * (CHA\_SOURCE_{delayed\_by\_D2})]$$

35A 36A 37A $$- [K_3 * (CHB\_SOURCE_{delayed\_by\_D3})] + [K_4 * (CHA\_SOURCE_{delayed\_by\_D4})] + \ldots$$

Fig. 1A 31B 32B 33B 34B $$CHB\_OUT = CHB\_SOURCE - [K_5 * (CHA\_SOURCE_{delayed\_by\_D5})] - [K_6 * (CHB\_SOURCE_{delayed\_by\_D6})]$$

35B 36B 37B $$+ [K_7 * (CHA\_SOURCE_{delayed\_by\_D7})] + [K_8 * (CHB\_SOURCE_{delayed\_by\_D8})] - \ldots$$

Fig. 1B $$SURROUND\_A\_OUT = - [K_9 * (CHB\_SOURCE_{delayed\_by\_D9})] + [K_{10} * (CHA\_SOURCE_{delayed\_by\_D10})]$$

$$+ [K_{11} * (CHB\_SOURCE_{delayed\_by\_D11})] - \ldots$$

FIG. 1C $$SURROUND\_B\_OUT = [K_{12} * (CHA\_SOURCE_{delayed\_by\_D12})] + [K_{13} * (CHB\_SOURCE_{delayed\_by\_D13})] - [K_{14} * (CHA\_SOURCE_{delayed\_by\_D14})] - \ldots$$

Fig. 1D $$SURROUNDA\_OUT = - [K_9 * ((CHA\_SOURCE\text{-}CHB\_SOURCE)_{delayed\_by\_D9})] + [K_{10} * ((CHA\_SOURCE\text{-}CHB\_SOURCE)_{delayed\_by\_D10})] + [K_{11} * ((CHA\_SOURCE\text{-}CHB\_SOURCE)_{delayed\_by\_D11})] - \ldots$$

Fig. 1E $$SURROUNDB\_OUT = + [K_{12} * ((CHA\_SOURCE\text{-}CHB\_SOURCE)_{delayed\_by\_D12})] + [K_{13} * ((CHA\_SOURCE\text{-}CHB\_SOURCE)_{delayed\_by\_D13})] - [K_{14} * ((CHA\_SOURCE\text{-}CHB\_SOURCE)_{delayed\_by\_D14})] - \ldots$$

Fig. 1F

PROCESS FOR ENHANCING THE EXISTING AMBIENCE, IMAGING, DEPTH, CLARITY AND SPACIOUSNESS OF SOUND RECORDINGS

CROSS-REFERENCE TO RELATED APPLICATIONS

This application is entitled to the benefit of Provisional Patent Application Ser. No. 60/210,976, filed 2000 Jun. 12.

BACKGROUND—FIELD OF INVENTION

This invention relates to audio recording and reproduction technology, and methods to enhance a recording's sound quality.

BACKGROUND—DESCRIPTION OF PRIOR ART

Summary of Prior Art

A study of the prior art reveals:

For mono and stereo recordings: there has been no effective process specifically dedicated to enhance the existing uncorrelated ambience (with stereo output as the intended result). There is a need for such a process to improve poor sound recordings and repair damaged recordings.

For stereo to surround conversion: Previous attempts at enhancing existing recordings by extracting their uncorrelated ambience to surround loudspeakers have produced relatively weak results (phasing against the direct sound, poor decorrelation, coloration [comb filtering], poor ambience extraction, and easy "breakup"). In this discussion, the term "breakup" is defined as perceived leakage of direct front channel information into the surrounds, diluting the location of the front channel image.

It is important to distinguish the process called "ambience extraction" from the more commonly-known "ambience generation", "simulation", or "artificial reverberation" processes. Ambience generation creates artificial ambience where there was little or none before, while in contrast, ambience extraction (also known as ambience recovery) enhances the quality and amount of the existing ambience (already mixed with the direct sound) in a recording.

There are numerous patents and processes that are designed specifically to change the imaging of the direct portion of a stereo or surround sound source and/or redirect signal information to new channels or locations, often using amplitude (steering) and directional matrices to accomplish the signal redirection. There are also numerous patents which incorporate delay lines, but almost none use these delays in an inaudible manner, that is, taking advantage of the Haas effect. Most of these patents have no specific concern with enhancing or reshaping the embedded ambience in the sound source. Most of these patents are not cited below because their methods and intentions are entirely different from the novel methods and intentions of the present invention. The following discussion of prior art is primarily limited to citations of ambience extraction rather than ambience generation.

Prior Art in Detail

1950s

Manfred R. Schroeder, "An Artificial Stereophonic Effect Obtained From A Single Audio Signal", *Journal of the Audio Engineering Society*, Vol. 6, No. 2, April 1958. Citing original research by Lauridsen, Danish Radio, 1954, Schroeder studied the effect created by taking a mono source, centering it in the stereo image, and combining it with a delay in one polarity to the left channel, and the other polarity to the right. Schroeder discussed using a long delay, from 50 to 150 ms, which can cause echo effects of its own. He concluded that it is not necessary to use a delay to accomplish the stereophonic effect, that the effect could just as easily be created by comb filtering. He concluded that an all-pass network could accomplish the job as easily as a delay, thus missing the advantage of the Madsen effect (explained below) as a device to extract ambience in the mono source to the stereo result. Any ambience enhancement coming from Schroeder's approach was unintentional and relatively weak. Since Schroeder's time, several manufacturers have built the Schroeder (Lauridsen) circuit into boxes designed to create an artificial stereophonic effect.

1960s

Van Sickle, May 1966, U.S. Pat. No. 3,249,696, used a circuit that is a simple matrix to derive and increase the out of phase components of an existing stereo source. Since out of phase components contain correlated as well as uncorrelated information, the out of phase components contain more than just the recording's ambience. No delay is used, and thus any ambience extraction is relatively weak, plus this type of circuit can create a "phasey" sound and change the mix of the direct components of the stereo signal.

Bauer, 1963, *IEEE Trans. on Audio* AU-11, 88, demonstrated a pseudo-stereo effect via phase shifting, which produces very weak ambience extraction, and seems to benefit from the Schroeder or Lauridsen effect.

1970s

Robert Orban, in the *Journal of the Audio Engineering Society*, April 1970, used all-pass networks to generate a complementary comb filter effect. No delay lines were used, and the process probably produced little or no ambience extraction. He was primarily concerned with creating an artificial spacious effect. Orban's article led to U.S. Pat. No. 3,670,106 for a stereo synthesizer.

Madsen Effect

In the *Journal of Audio Engineering Society*, October 1970, Volume 18, Number 5, E. Roerbaek Madsen described a method for extracting (decoding) ambience information from ordinary recordings by harnessing a secondary attribute of the Haas effect. Madsen cited the principles discovered by Helmut Haas from the Journal *Acustica* 1, No. 1, 49 (1951). The Haas effect, also known as the "precedence" or "fusion" effect, illustrates that if a sound source is followed by a closely-spaced echo, the ear will combine the two, or "fuse" them as one single source, rather than identify them as two entities. Madsen proved that if a sound recording is reproduced along with a simple spatially-separated delay of that source . . . the ambience embedded in that source will be extracted along a spatial path between the source and its delayed replica.

It is critical for the reader to understand how the "Madsen effect" works. Imagine a monophonic recording of a snare drum made in a reverberant chamber, or recorded with artificial reverberation. Reproduce that recording on one loudspeaker, then delay the sound by a Haas-length delay and feed it to another loudspeaker. Because of the Haas effect, the ear fuses the direct (correlated) portion of the delayed sound (e.g. the snare drum's initial attack and body) with the original source and continues to locate the direct sound at the source loudspeaker. However, because ambience (reverberation) is uncorrelated, the ear does not recognize the ambience as being a repeat of the original sound, and thus, the ambience is extracted to the delay loudspeaker. Madsen showed that this extracted ambience accurately reproduces the sound of the original recording space, especially when many delay loudspeakers are used in the reproduction room. Further requirements are that the delay not be too short, not too long, and the amplitude of the delay not too loud, or the primary image of the snare drum will shift towards the delay loudspeaker, or the listener will hear a double sound. The acceptable range is often called the fusion zone or Haas zone. Madsen cautioned against using a delay shorter than about 2.5 ms because it approached the Haas ambiguity zone or longer than 10–15 ms to avoid a double effect. But delays of 15 ms yield relatively weak ambience extraction.

Hafler

Hafler, U.S. Pat. No. 3,697,692, October, 1972. David Hafler patented the use of an L-R (difference) circuit explicitly for the purpose of extracting ambience to rear loudspeakers. His circuit did not employ a delay, and therefore produced relatively weak ambience extraction and easy breakup. However, it was the first circuit designed to extract ambience from the front to the rear channels. The other problem is that an L-R circuit contains not only uncorrelated ambience information, but also correlated difference information, another reason for the easy front-to-rear breakup.

Hilbert

Hilbert, Nov. 13, 1973, U.S. Pat. No. 3,772,479. A stereo effect enhancement system using variable gain amplifiers, comparator circuits and matrices. Designed to increase the difference component rather than the uncorrelated components of the source. The two are not congruent. This approach changes the mix of the elements of the direct (front) signal, and may produce some phasing effects.

Ohshima

Ohshima, November 1974, U.S. Pat. No. 3,849,600. Another matrix-based circuit to increase the level of the difference signal in the front, stereo channels.

1980s

Cohen

Cohen, Aug. 11, 1981, U.S. Pat. No. 4,283,600. This patent is for an audio reproduction system. Cohen cited the Madsen paper, though giving an incorrect date. The Cohen patent was a genuine ambience extraction technique that did not use artificial reverberation or multiple recirculation. It used multiple loudspeakers to accomplish multiple Haas delays. Each successive delay was less than the Haas limit (50 ms) to prevent hearing a double sound, and each successive delay was assigned to the next one of a plurality of loudspeakers in a line extending from front to rear of the listening room. The delays used are also alterable so as to produce a simulated concert hall effect if desired. A matrix is not used. The Cohen patent yielded relatively weak ambience extraction due to the limited bandwidth of the analog delays used and potential breakup from front to surround because the particular implementation of Haas kicks may easily unmask the kicks as separate sources of their own. The process, implementation and application of the Cohen patent is different than that of the present invention.

Haramoto

Haramoto, et al, U.S. Pat. No. 4,359,605, Nov. 16, 1982. Developed a stereo synthesis circuit for headphones which employed delays for the specific purpose of localizing artificial sound sources outside of the listener's head. Any ambience extraction capability of this circuit is unintentional. The phase cancellations of the addition and filtering circuits can produce "phasey" images. The device used a plurality of delay taps intended to be audible rather than inaudible, specifically for the purposes of creating newly located images, e.g., simulation of room reflections.

Klayman

Klayman, Jun. 20, 1989, U.S. Pat. No. 4,841,572 for a stereo synthesizer. He delayed a matrixed difference signal and mixed it back into the stereo source, to increase the amount of out of phase material in a recording. This technique enhanced the ambience in a recording to a small degree, it may cause some "phaseyness" or comb filtering, and also change the mix of the instruments and voices of the stereo mix.

Dolby Surround

Dolby Surround was invented specifically to send separate "effects sounds" to surround loudspeakers, using an L-R steering matrix and a single delay line feeding a plurality of loudspeakers. An unintended benefit of its delay line is the Madsen effect. Production engineers noted that some of the reverberation inherent in the music score was extracted to the surround loudspeakers. Dolby Surround's ambience extraction power is limited by its low bandwidth (circa 6 kHz), simple delay, and the use of a Dolby B expander circuit as a noisegate in the surround channels.

Others

Benchmark Acoustics produced a consumer ambience extraction product; it incorporated a delay line and an L-R matrix feeding the surround loudspeakers. Benchmark inverted the polarity of one channel of the surround loudspeakers to enhance the ambiguity of the surround ambience. The Benchmark's ambience extraction abilities were relatively weak because of narrow bandwidth, poor headroom and use of a simple delay line. Phoenix Systems produced a consumer "Delay Enhanced L-R Decoder", using a discrete delay expressly for the purpose of extracting front channel ambience to surrounds, with a relatively narrow bandwidth circa 12 kHz; the device had relatively weak ambience extraction ability and suffered from easy breakup.

1990s

Hulsebus

Hulsebus, 1997, U.S. Pat. No. 5,677,957, employed filtering and differencing (L-R) circuits for the purpose of enhancing the ambience in a stereo audio system. This process produced relatively weak ambience extraction and could easily create "phasing" effects. It also changed the mix of the original source material because of adding in undelayed frequency selective components to the source.

Desper

Desper, May 2, 1995, U.S. Pat. No. 5,412,731 and Apr. 20, 1999, U.S. Pat. No. 5,896,456, employ filtering, differencing and delay circuits for the purpose of creating phantom (boundary) images, thus enhancing the imaging in a stereo audio system. Enhanced ambience is cited as a secondary benefit, without specifically naming Madsen's paper. The patent(s) is concerned with producing discrete phantom images using knowledge of interaural time delay, difference information, and crosstalk cancellation rather than enhancing the uncorrelated (random ambience). In other words, Desper is primarily concerned with redirecting discrete sounds to new (phantom) locations. Some mild ambience extraction in the direction of the phantom image area may be obtained from the Desper system if the adjustable delay is raised above 2.5 ms. The differencing circuits may also change the mix of the direct components of the stereo mix. The methods, purposes and results of the Desper technique are different from those of the present invention.

Klayman

Klayman, Oct. 19, 1999, U.S. Pat. No. 5,970,152, employs filtering, differencing, phase shifting and matrixing circuits for the purposes of enhancing the imaging amongst the loudspeakers and of reshaping the imaging in a multi-channel audio system. This process produces relatively weak ambience extraction and can easily create "phasing" effects. It also changes the mix of the original source material because of adding in undelayed frequency selective components back into the source.

Kamkar

Kamkar, Dec. 14, 1999, U.S. Pat. No. 6,002,776. This is a directional acoustic signal processor designed to enhance the directivity of signals. It is also an ambience generator, and like most ambience generators, Kamkar requires a plurality of random or incoherent delays to achieve ambience generation.

SUMMARY

In accordance with the present invention, the ambience, depth, imaging, spatiality and other attributes of existing mono and stereo recordings can be effectively enhanced while using only 2 loudspeakers, and without altering the original mix of direct sounds. In addition, mono and stereo recordings can be further enhanced by adding a pair of surround channels to the front, and extracting ambience from the front channels to the surround. These benefits are accomplished by effectively harnessing a known psychoacoustic effect.

OBJECTS AND ADVANTAGES

In one embodiment, a process is provided for enhancing ambience in audio source signals. The processing includes generating a first audio signal and generating a second audio signal; delaying and attenuating said second audio signal to form a third audio signal; summing said third audio signal with said first audio signal to form a fourth audio signal; delaying and attenuating said first audio signal to form a fifth audio signal; subtracting said fifth audio signal from said fourth audio signal to form a sixth audio signal; delaying and attenuating said second audio signal to form a seventh audio signal; subtracting said seventh audio signal from said sixth audio signal to form an eighth audio signal; delaying and attenuating said first audio signal to form a ninth audio signal; and summing said eighth audio signal with said ninth audio signal to form an output signal for one channel of a multiple channel audio system for driving a speaker. Using this process, the ambience of one channel of an audio system is enhanced.

In one embodiment, the process further includes delaying and attenuating said first audio signal to form a tenth audio signal; subtracting said tenth audio signal from said second audio signal to form an eleventh audio signal; delaying and attenuating said second audio signal to form a twelfth audio signal; subtracting said twelfth audio signal from said eleventh audio signal to form an thirteenth audio signal; delaying and attenuating said first audio signal to form a fourteenth audio signal; summing said fourteenth audio signal with said thirteenth audio signal to form a fifteenth audio signal; delaying and attenuating said second audio signal to form a sixteenth audio signal; and summing said sixteenth audio signal with said fifteenth audio signal to form an output signal for a second channel of a multiple channel audio system for driving a speaker. Through the use of this process, the ambience of two channels of an audio system are enhanced.

In one embodiment, the step of generating a second audio signal includes generating a copy of said first generated audio signal in a monaural audio system. In one embodiment, the process may include delaying and attenuating said second audio signal to form a seventeenth audio signal; inverting said seventeenth audio signal to form an eighteenth audio signal; delaying and attenuating said first audio signal to form a nineteenth audio signal; summing said eighteenth and nineteenth audio signals to form a twentieth audio signal; delaying and attenuating said second audio signal to form a twenty first audio signal; and summing said twentieth and twenty first audio signals to form a first surround sound channel audio signal.

In one embodiment, the process may include delaying and attenuating said first audio signal to form a twenty second audio signal; delaying and attenuating said second audio signal to form a twenty third audio signal; summing said twenty second and twenty third audio signals to form a twenty fourth audio signal; delaying and attenuating said first audio signal to form a twenty fifth audio signal; and subtracting said twenty fifth audio signal from said twenty fourth audio signal to form a second surround sound channel audio signal.

In one specific embodiment, second audio signal is delayed about 30 milliseconds to form the third audio signal.

In one specific embodiment, the first audio signal is delayed about 30 milliseconds to form the tenth audio signal.

In one specific embodiment, the second audio signal is attenuated about 15 decibels to form the third audio signal.

In one specific embodiment, the first audio signal is attenuated about 15 decibels to form the tenth audio signal.

The present invention . . .

(a) greatly increases ambience extraction ability because the delays are wide bandwidth (b) greatly increases ambience extraction ability because the initial delay is the maximum possible before the Haas curve goes downhill (typically 30 ms). Madsen actually cautioned against using delays longer than about 15 ms, but the present inventor has discovered that up to 30 ms works much better and does not produce audible problems when implemented in the preferred and alternate embodiments.

(c) greatly increases ambience extraction ability, spreads and diffuses the extracted ambience, because of non-random, discretely-defined, spatially-located, sometimes inverted, multiple "Haas kicks", which extend the fusion zone to 60–90 ms or more. This is accomplished without artifacts such as comb filtering, phasiness or artificial effects.

(d) unmasks 60 to 90 ms or more of the early reverberation inherent in the sound recording, thus enhancing the character of the sound recording which comes from the recording hall.

(e) provides increased sound clarity, probably due to the unmasking effect of the extended and spread Haas zone.

(f) provides improved speech intelligibility of mono sources which have been "stereoized" by the present invention, probably due to the ear's binaurally separating the side-spread ambience from the center-located speech source.

(g) provides improved stereophonic imaging, probably due to the opposite channel Haas delay(s) separating the ambience from the source and reinforcing the location of the instrument or voice.

(h) as a surround enhancer, solidifies the position of the sound source to the front channels without "breakup" (leakage of direct sound from front to surround). This is more effective than previous approaches, which did not use spatially separated multiple Haas kicks mixed to the surround channels.

(i) Maintains the original "direct" mix of the front channels relatively unchanged, unlike prior art techniques which added selective amounts of difference material back into the source.

(j) greatly reduces the chance of hearing a double sound effect often associated with discrete delays, permitting use with short (percussive) sounds.

(k) produces a pleasant, synergistic sound improvement which is greater than the sum of its parts. Recordings have improved imaging and focus, dimensionality, clarity, larger depth of field and spatiality, and an ambient field with greater audibility, diffusion, spread and depth—with or without surround loudspeakers.

(l) provides an effective means by which production and mastering engineers can improve the sound of a recording, to be used while preparing recordings for mass distribution.

(m) provides a means by which existing mono, stereo and surround recordings may be enhanced during consumer audio reproduction or auditioning. Effectively "converts" mono recordings to stereo with a more powerful stereo effect than the prior art; "converts" mono or stereo recordings to surround with a more powerful and natural surround ambience than the prior art.

(n) provides a forensic tool for enhancing the intelligibility of poor speech recordings.

(o) provides a means of restoring lost ambience in older audio recordings, without destroying the intent of the original recording producer.

(p) Provides a unique "dialog surround" mode which extracts ambience from center channel information, stereoizes it to the Left and Right Outputs, and also to the Surrounds, for more realistic (life-like) dialog in films, radio and television.

(q) provides a unique mono mode used primarily for ADR work in films, to move the apparent distance of an actor further from a microphone after he/she has already been recorded.

(r) provides a unique means of equalizing the ambient component of an original recording without affecting its direct sound component.

(s) takes maximum advantage of the original ambience in a sound source or recording, avoiding or reducing the need to use artificial ambience.

(t) increases the ratio of uncorrelated to correlated sound in a sound source or recording, without introducing undesirable antiphasic phantom images of the direct sound.

(u) is perceivable as an improvement even in an inferior monitoring environment such as a car.

(v) provides a true stereophonic (uncorrelated) ambient field, as opposed to the monophonic field that results from using a difference matrix.

Further objects and advantages include simplicity and economy of design in the preferred embodiment. Still further objects and advantages will become apparent from a consideration of the ensuing description and drawings.

DRAWING FIGURES

In the drawings, closely related figures have the same number but different alphabetic suffixes.

FIGS. 1A to 1F show the master algorithm (formulas, equations) which defines the method of ambience extraction.

REFERENCE NUMERALS IN DRAWINGS

Figure 2:
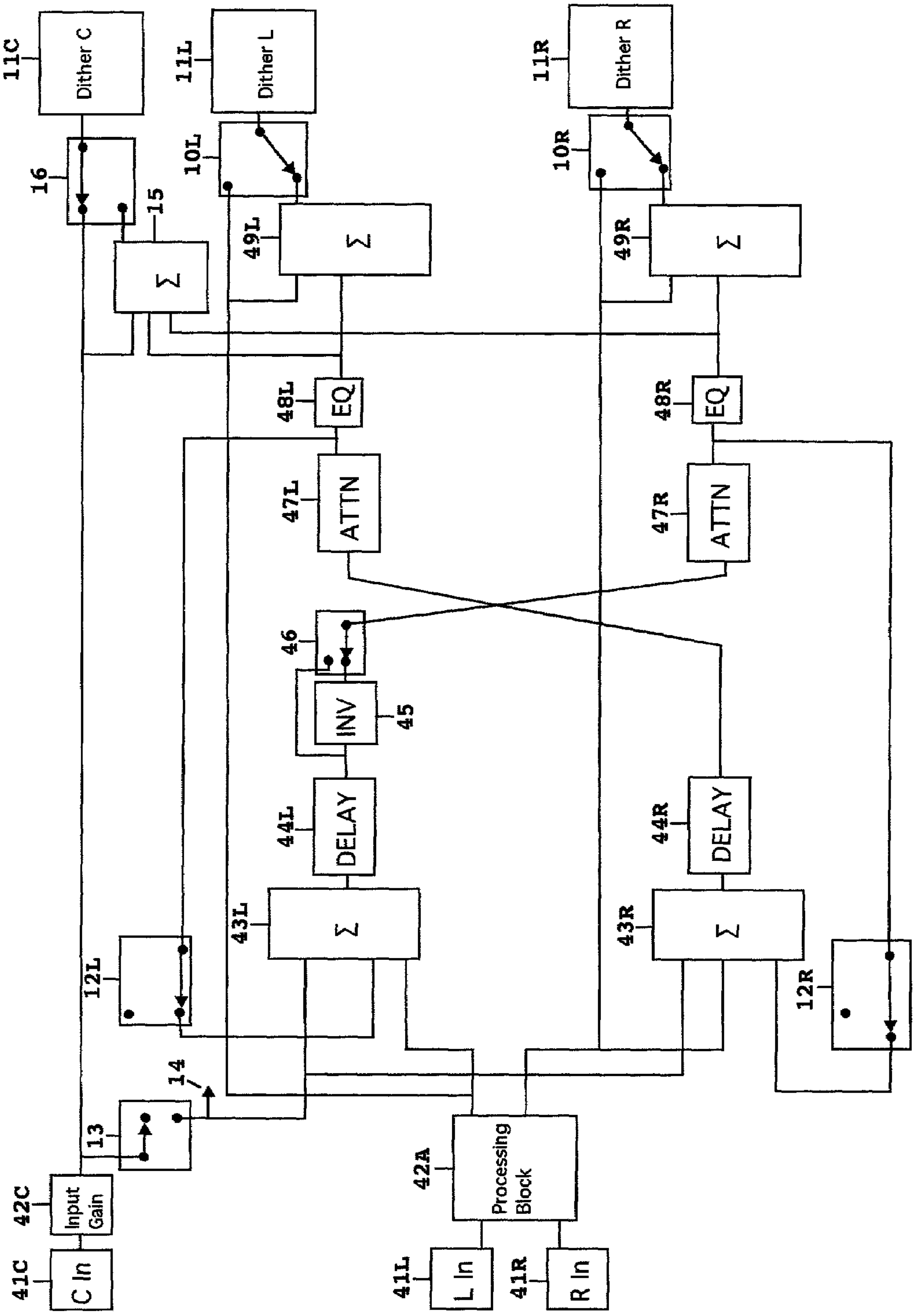
FIG. 2 shows the front channels of the preferred embodiment, a processor designed to master stereo or surround program material.

10L Left Ch. Bypass Switch 10L
10R Right Ch. Bypass Switch 10R
11L Left Dither 11L
11R Right Dither 11R
11C Center Dither 11C
11LS LS Dither 11LS
11RS RS Dither 11RS
11LFE LFE Dither 11LFE
12L Feedback L Switch 12L
12R Feedback R Switch 12R
13 Dialog Ambience Switch 13
14 Dialog Amb. to Surrounds 14
15 Center Summing Network 15
16 Center Bypass Switch 16
17 Surround Feed Switch 17
18A LS Summing Network 18A
18B RS Summing Network 18B
19A Left Surround Delay 19A
19B Right Surround Delay 19B
20 Surround Inverter 20
21A LS Ambience Attenuator 21A
21B RS Ambience Attenuator 21B
22A LS Ambience EQ 22A
22B RS Ambience EQ 22B
23A LS Summing Network 23A
23B RS Summing Network 23B
24A LS Bypass Switch 24A
24B RS Bypass Switch 24B
25A LS Secondary Amb. Switch 25A
25B RS Secondary Amb. Switch 25B
26A LS Secondary Amb. Atten. 26A
26B RS Secondary Amb. Atten. 26B
31A Ch. A Out 31A
31B Ch. B Out 31B
32A Ch. A Source 32A
32B Ch. B Source 32B
33A Term 33A
33B Term 33B
34A Term 34A
34B Term 34B
35A Term 35A
35B Term 35B
36A Term 36A
36B Term 36B
37A Term 37A
37B Term 37B
41L Left Ch. Input 41L
41R Right Ch. Input 41R
41C Center Ch. Input 41C
41LS Left Surr. Input 41LS
41RS Right Surr. Input 41RS
41LFE LFE Input 41LFE
42A Processing Block 42A
42L Left to Surr. Input Gain 42L
42R Right to Surr. Input Gain 42R
42C Center Input Gain 42C
42LS LS Input Gain 42LS
42RS RS Input Gain 42RS
42LFE LFE Input Gain 42LFE
43L Left In Summing Network 43 43L
43R Right In Summing Network 43R
44L Left Delay 44L
44R Right Delay 44R
45 Front Inverter 45
46 Inverter Bypass Switch 46
47L Left Ambience Attenuator 47L
47R Right Ambience Attenuator 47R
48L Left Ambience EQ 48L
48R Right Ambience EQ 48R
49L Left Out Summing Network 49L
49R Right Out Summing Network 49R

DESCRIPTION—FIGS. 1A TO 1F—MASTER ALGORITHM USED IN ALL EMBODIMENTS

FIGS. 1A to 1F contain the formulas for the master algorithm, whose equations and derivatives are used in all embodiments; this algorithm is optimized for maximum extraction of the inherent ambience in stereo and/or surround recordings and enhancement of that ambience. For mono and stereo recordings, this algorithm extracts (decodes) existing ambience, makes it more audible, reshapes it and adds it back into the stereo program at a user-specified level. For surround recordings, this algorithm extracts the ambience from the front channels to the surround channels. FIG. 1A (Ch. A), and FIG. 1B (Ch. B), are equations that together describe a 2-in, 2-out audio mixer, or summer. The terms of each equation are numbered 31, 32, 33, etc., with reference numeral 31A being the first term of the A Channel, 31B the corresponding first term of the B channel, etc.

These equations define the characteristics of a very few carefully-defined and carefully-placed maximum Haas-length delays. The design and purpose of the delays used in the present invention are distinctly different from those used in a reverberator (ambience generator). The present invention uses a small number of delays which are purposely correlated (non-random, predictable, rational, and widely-spaced); while an ambience generator uses a plurality of delays which are purposely uncorrelated (randomized, unpredictable, irrational, and densely-spaced).

Stereo Enhancement, FIGS. 1A and 1B

FIGS. 1A and 1B are equations that illustrate how a Ch. A Source 32A and a Ch. B Source 32B are manipulated to become Ch. A Out 31A and Ch. B Out 31B, with enhanced ambience in the outputs. Channel A represents either channel of a stereo source and Channel B the other, or, if the source is mono, it is duplicated to the A and B sources.

In FIG. 1A, the Ch. A Out is derived from the sum of several elements (terms). The Ch. A Source is first summed (mixed) with Term 33A, which consists of the Ch. B Source delayed by a Haas delay of length D1 and attenuated by an amount K1. Note the crossed channels. Next, Term 34A, is mixed in with inverted polarity (−sign). The Term 34A is the Ch. A source delayed by a longer delay of length D2 and attenuated by a greater attenuation K2. Next, Term 35A once again crosses channels, and is mixed in with inverted polarity. The Term 35A is the Ch. B Source delayed by an even longer delay of length D3 and attenuated by an even greater attenuation K3. Next, Term 36A is the Ch. A Source delayed by an even longer delay of length D4 and attenuated by an even greater attenuation K4. This equation potentially repeats to infinity (until the increased attenuations result in inaudible sound) represented by Term 37A (ellipses . . . ). The pattern of polarities of the delayed terms is four terms: +, −, −, +, theoretically repeated to infinity. The acoustically usable number of repeats is about 4–5.

In FIG. 1B, the Ch. B Out is the sum of several elements, beginning with the Ch. B Source. Next, Term 33B is mixed in with inverted polarity; this is the Ch. A source delayed by a Haas delay of length D5 and attenuated by an amount K5. Note the crossed channels. The Terms 33A and 33B form a pair which are opposite in polarity from each other and assigned to opposite channels from the source (crossed channels). This spreads the Madsen-decoded ambience stereophonically, and as widely as possible, reduces center buildup, and also separates any off-center source from its ambience to reduce the masking effect. Next is Term 34B, also mixed in with inverted polarity; this is the Ch. B source delayed by a longer delay of length D6 and attenuated by a greater attenuation K6. The pair of terms 34A and 34B are not crossed in channel; they are in polarity with each other (although opposite in polarity from the source). Next, Term 35B once again crosses channels. The Term 35B is the Ch. A Source delayed by an even longer delay of length D7 and attenuated by an even greater attenuation K7. Next, Term 36B is the Ch. B Source delayed by an even longer delay of length D8 and attenuated by an even greater attenuation K8. This equation potentially continues to infinity (until the increased attenuations result in inaudible sound) represented by Term 37B (ellipses . . . ). The pattern of polarities of the delayed terms is four terms: −,−,+,+ repeated to infinity.

Haas Kicks

The multiple delayed terms form what acousticians call “Haas kicks”. In this invention, the Haas kicks significantly extend the total length of the fusion zone of any source to a time equal to the sum of all the delays of that source (as long as the attenuations are sufficient). For example, if each delay is 30 ms, the time between the first and second repeat of a source is only 30 ms, which is within the normal Haas limits, though the total delay between the original source and its second repeat is now 60 ms. In the present invention, each succeeding Haas kick is placed in the opposite channel from its own “source” (the preceding term), thereby further spreading and “opening up” the total decoded ambience, diffusing it, and helping to unmask the ambience by locating it in a different position than the source. Utilizing Haas kicks in this novel way maximizes the psychoacoustic power of the Madsen effect. Note that only the uncorrelated ambience is psychoacoustically “decoded”, the ear ignoring the correlated aspects of these repeats. Thus, the integrity and tonal balance of the original stereo image of the direct sound are strongly preserved, without “phasing” effects.

The amount of extracted ambience is adjusted by the attenuations K1 through K(infinity). In the preferred embodiment, attenuation K is a user-adjustable control, which may be labelled “ambience level”.

Surround Enhancement, FIG. 1

FIG. 1A and FIG. 1B represent any paired channels of a recording, a source and its Haas-kick-multiplied-cross-channeled-delay. For example, a front stereo pair, or two surround channels which could be treated in order to distribute ambience between them. In the preferred embodiment, an option is provided that treats the surround system as a pair from which ambience may be extracted.

Method One-Extract Surround Ambience from Stereo Front Information

FIGS. 1C and 1D are equations representing one method of extracting front channel ambience to the surrounds. In FIGS. 1C and 1D, the front channels and surround channels of a recording are treated as two pairs, which for maximum ambience extraction and spatiality the surround delays are treated in diagonals. That is, the first Haas delay in the right surround comes from the front left source and the first Haas delay in the left surround comes from the front right source. However, the equation is general, and surround channels labelled “A” and “B” may represent left or right surround in either order. An embodiment of this invention can decide which order to use. The choice of order will change the surround implementation to spreading the ambience either:

diagonally opposite the front or perpendicularly opposite the front.

In the preferred embodiment, they are in diagonals.

FIG. 1C shows how Surround channel A is created from elements of the front channels plus delays. The method of the equation in FIG. 1C is identical to that of FIG. 1A without the Term 32A and with corresponding terms having inverted polarity compared to the front, to increase "vagueness", diffusion and spread of the ambience extracted to the surrounds. Similarly, FIG. 1D shows how Surround channel B is created, which is identical to the method of FIG. 1B without the term 32B and with similarly inverted terms.

Method Two-Extract Surround Ambience from Matrix of Front

Information

The other method for extracting front channel ambience to the surrounds involves a difference matrix between the two front channels. FIGS. 1E and 1F show how Surround channels A and B are created if the matrix method is used. The preferred embodiment allows switching between Method one and Method two. The matrix is not required to obtain effective ambience extraction, but may allow further increase in surround ambience levels without causing breakup.

Simplifying Construction

Figure 3:
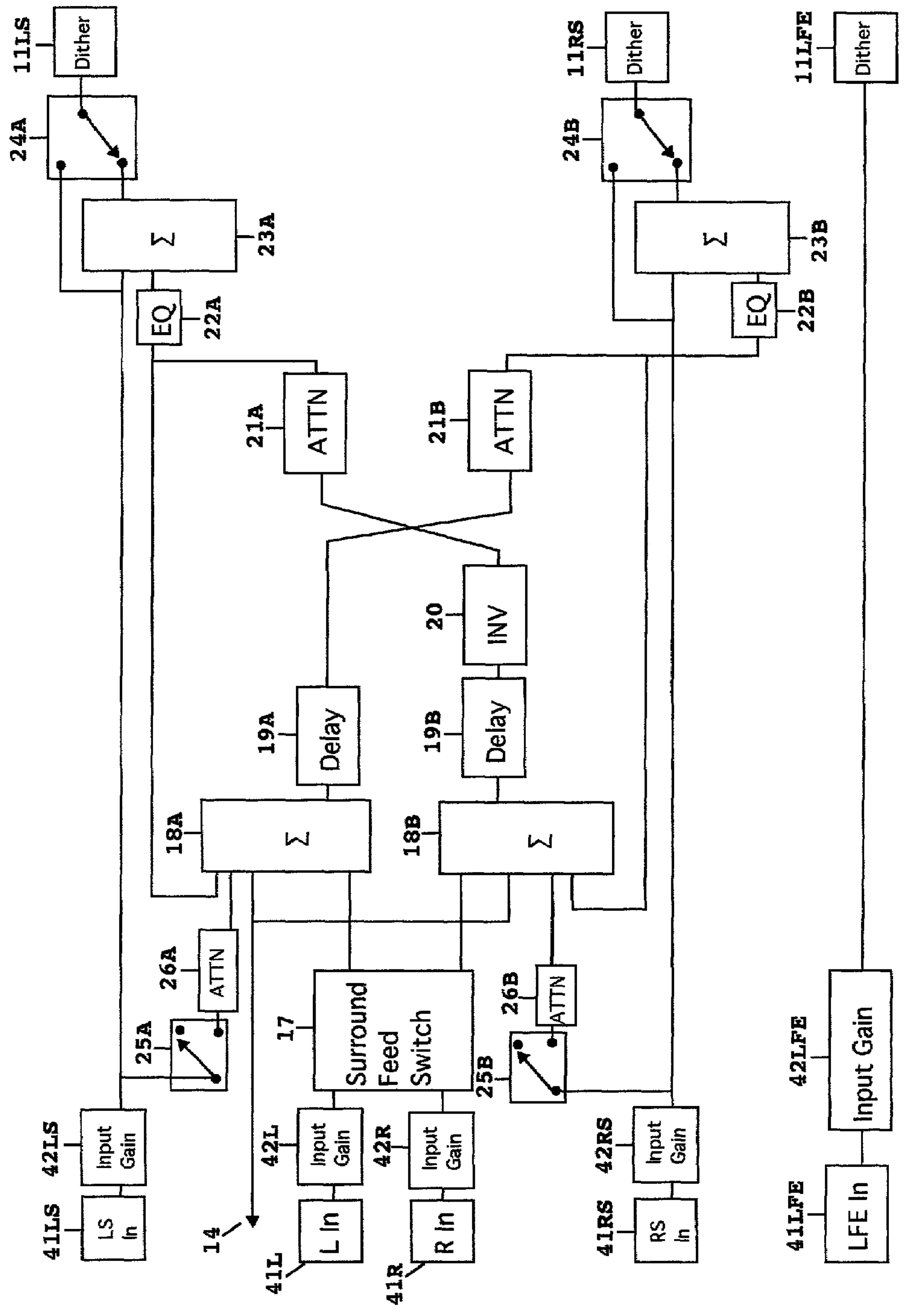
FIG. 3 shows the surround and LFE channels of the preferred embodiment.

Construction of the preferred embodiment can be greatly simplified by using certain value relationships of the equation variables. In the preferred embodiment, all the initial delays are equal in length, that is, D1=D5=D9. All the second delays are twice the first delay, e.g, D2 is twice D1 (typically 2*30=60 ms), D3 is three times D1 (typically 3*30=90 ms), and so on. All the initial attenuations are equal in value, that is, K1=K5=K9. Each succeeding attenuation is the decibel sum of the previous, e.g., if attenuation K1 is 15 dB, then K2 is 30 dB, K3 is 45 dB and so on. FIG. 2 and FIG. 3, to be described, demonstrate how this permits a simple circuit with relatively few elements. Note that in the preferred embodiment, when the source is mono, then the terms 33A and 33B cancel out, improving mono-compatibility.

Altering the Quality of the Effect

The shape, spread and depth of the extracted ambience may be altered by changing some aspects of the equations. The depth of the decoded ambience can be reduced by eliminating all or some of the Terms 34 and beyond. The spread and shape of the decoded ambience can be changed by changing all or some of the reversed polarity terms to positive polarity. The crossing of channels may also be eliminated, or postponed till the second or later Haas kick, but this severely reduces the extent of the ambience extraction.

FIGS. 2 and 3—Preferred Embodiment

FIG. 2 (Front Channels)

This is the block diagram of the front channels of the preferred embodiment, which can be either a hardware or software-based process(or). Left Channel and Right Channel Sources enter Left Ch. Input 41L and Right Ch. Input 41R, respectively. These inputs represent the digital audio inputs of a digital processor with a standard digital audio interface, or can come from an analog to digital converter, or can be all or part of a computer program that processes audio files, or be part of a digital audio console, or any other audio device that may logically incorporate the present invention. Mono or Stereo source signal leaves the inputs and enters Processing Block 42A. Inside the Processing Block, the following is adjustable: input gain, input L/R balance, M/S ratio (via an MS encode-decode cycle), and equalization. MS processing is provided for convenience, and is not required for ambience extraction to take place. Output of the Processing Block is stereo (2-channel).

Direct Signal Flow

Left channel input signal leaves the Processing Block 42A and enters Left In Summing Network 43L. Signal leaves the Network 43L and enters a wide bandwidth Left Delay 44L. Signal then leaves the Delay 44L and enters Front Inverter 45. Signal leaves the Front Inverter and enters Inverter Bypass Switch 46, which is shown in the position that engages the inverter. If the Switch 46 is in the other position, the Inverter 45 is bypassed. Output of this switch then crosses channels to the right side and enters Right Ambience Attenuator 47R. The output of the Atten. 47R enters Right Ambience EQ 48R, which may be used to tailor the frequency response of the extracted ambience. Output of the EQ 48R enters Right Out Summing Network 49R, where this delayed signal is summed with the Right channel source. Output of the Network 49R enters Right Ch. Bypass Switch 10R, which is shown "not bypassed", so that the enhanced signal may be passed to Right Dither 11R. From here Right Channel signal is passed to the outside world. All dither modules include group delay compensation so channels remain in phase with each other.

Direct signal flow for the right channel source follows a mirror-image route to the above, except there is no inverter in the signal path. Right channel signal leaves the Processing Block 42A and enters Right In Summing Network 43R. Signal leaves the Network 43R and enters a wide bandwidth Right Delay 44R. Signal then leaves the Delay 44R, crosses channels to the left side and enters Left Ambience Attenuator 47L. The output of the Atten. 47L enters Left Ambience EQ 48L, which may be used to tailor the frequency response of the extracted ambience. Output of the EQ 48L enters Left Out Summing Network 49L, where this delayed signal is summed with the Left channel source. Output of the Network 49L enters Left Ch. Bypass Switch 10L, which is shown "not bypassed", so that the enhanced signal may be passed to Left Dither 11L. From here, Left Channel signal is passed to the outside world.

Feedback Signal Flow

The previously delayed and channel-crossed left channel signal which is now at the output of the Atten. 47R may be fed back through Feedback R switch 12R, which is shown closed, sending signal into the Network 43R. The previously delayed and channel-crossed right channel signal which is now at the output of the Atten. 47L may be fed back through Feedback Left switch 12L, which is shown closed, sending signal into the Network 43L. This creates the cycle of multiple-attenuated-crossed-channel Haas delays obeying the formulas in FIG. 1A and 1B.

Option—Stereoize Center Channel

Also included in FIG. 2 is Center Ch. Input 41C, which feeds Center Input Gain 42C and then enters Center Bypass Switch 16 which is currently shown in Bypass condition. From here the Center channel signal goes to Center Dither 11C, and thence to the outside world. Optionally, the user may choose to "stereoize" the Center channel (usually containing dialog) by sending Center Channel signal to the Left and Right Ambience Processing and the Surround Ambience processing. In that case, Center Channel signal at the Gain 42C enters Dialog Ambience Switch 13, which is currently shown open. If the Switch 13 is closed, Center signal enters the two Summing Networks 43L and 43R and goes through the aforementioned front channel direct and feedback cycles. Switched Center signal also goes to a point called Dialog Amb. to Surrounds 14, which is connected to the Surround portion of the system (to be viewed in FIG. 3).

Mono Mode

Also included in FIG. 2 is a Mono mode, used primarily for ADR work in films where it is desirable to increase an actor's apparent distance from the microphone after he/she has already been recorded. In this mode, the Input 41C becomes a Mono input. The Switch 13 is closed as in the previous paragraph, and the Switch 16 is unbypassed, converting the center channel to a mono output. When the Switch 16 is unbypassed, a Center Summing Network 15 combines the Center source with the multiple Haas delays coming from the left and right signal paths. In this mode, the Inverter 45 is automatically bypassed in software by the Switch 46 to prevent cancellation of any of the critical delays.

FIG. 3 (Surround Channels)

This is the block diagram of the surround and LFE channels of the preferred embodiment. Signal from the front channels is passed to the Surround ambience processing to extract front channel ambience to the Surround speakers.

The Inputs 41L and 41R enter Left to Surr. Input Gain 42L and Right to Surr. Input Gain 42R, respectively. Stereo output from the gain controls enters Surround Feed Switch 17. The Switch 17 can switch between an L-R matrix or a passthrough; the user chooses whether an L-R matrix or true stereo will feed the ambience extraction circuit.

Direct Signal Flow

Left channel output of the Switch 17 enters LS Summing Network 18A, then goes to Left Surround Delay 19A. Then the signal crosses channels and enters RS Ambience Attenuator 21B, then goes to RS Ambience EQ 22B where the ambience equalization may be adjusted. Output of EQ 22B enters RS Summing Network 23B. Signal then enters RS Bypass Switch 24B, which is shown "not bypassed", and then to RS Dither 11RS from which the RS Signal can enter the outside world.

Direct signal flow for the right surround channel follows a mirror-image route to that of the left surround channel signal except an inverter is added in the signal path. Right channel output of the Switch 17 enters RS Summing Network 18B, then goes to Right Surround Delay 19B, then to Surround Inverter 20. Output of the Inverter 20 crosses channels and enters LS Ambience Attenuator 21A, then goes to LS Ambience EQ 22A, where the ambience equalization may be adjusted. Output of the EQ 22A enters LS Summing Network 23A. Signal then enters LS Bypass Switch 24A, which is shown "not bypassed", and then to LS Dither 11LS from which the LS Signal can enter the outside world. All the delays have the same length and the paired left and right attenuators have matched attenuation.

Feedback Signal Flow

The previously delayed and crossed left channel signal now at the output of the Atten. 21B is fed back through the Network 18B. This creates the cycle of multiple-attenuated-crossed-channel Haas delays obeying the formulas in FIG. 1C to 1F. The previously delayed and crossed right channel signal now at the output of the Atten. 21A is fed back through the Network 18A. This creates the cycle of multiple-attenuated-crossed-channel Haas delays obeying the formulas in FIG. 1C to 1F.

Enhance LS and RS Signals

Another option in FIG. 3 is to enhance the Left and Right Surround (LS and RS) channels if they exist as stereo sources which have been sent to the surrounds. A Left Surr. Input 41LS enters LS Input Gain 42LS, then signal goes to LS Secondary Amb. Switch 25A, which is shown open. If the Switch 25A is closed, processing of the LS surround channel may be accomplished. Signal enters LS Secondary Amb. Attenuator 26A and into the Network 18A, where the ambience in the surrounds is extracted and reinserted to the surrounds via paths previously described. Right Surr. Input 41RS enters an RS Input Gain 42RS, then RS Secondary Amb. Switch 25B, which is shown open. If the Switch 25B is closed, processing of the RS surround channel may be accomplished. Signal enters RS Secondary Amb. Attenuator 26B and into the Network 18B, where the ambience in the surrounds is extracted and reinserted to the surrounds via paths previously described.

Dialog Surround Mode

Also included in FIG. 3 is an optional "dialogue surround" mode. The Switched Center Signal is at the point 14 which comes from FIG. 2. This signal goes to the Networks 18A and 18B, where the ambience from the front center channel is extracted to the surrounds via paths previously described.

LFE Signal Path

Also included in FIG. 3 is an LFE signal, which is never processed for ambience. The LFE signal passes into LFE Input 41LFE, to Input Gain block 42LFE, and out to the outside world through LFE Dither 11LFE. LFE signal passes through the processor only for the purpose of applying identical gain/loss and group delay to all channels.

Alternative Embodiments

Stereo-Only. In this embodiment, FIG. 2 may be used as a simple stereo-only processor by eliminating the Center Channel portions and the connection 14 between FIG. 2 and FIG. 3, because FIG. 3 would not be used.

Surround-Only. In this embodiment, FIG. 3 only is used, to enhance stereo material by extracting its ambience to surround channels, but leaving the front channels unaltered.

Stand-Alone. In this embodiment, all user-adjustable controls are eliminated, and the parameters are optimized for the dedicated application, e.g, broadcast, communications, telephony. It is likely the present invention will be incorporated into an integrated circuit in the stand-alone embodiment.

Operation

Since the present invention is most efficiently built using software, operating controls can take varied form, including virtual slider or rotary controls on a CRT screen operated by a mouse, a menu-driven GUI (graphical user interface), a remote control, a dedicated box with control knobs and indicators, etc. Therefore, this Operation description refers to the function of the controls and how they will be used rather than their physical implementation. And of course in a Stand-Alone embodiment, there will be no user-adjustable controls at all.

Operating Controls

The most important user control is the level of extracted ambience to the left and right channel, controlled by the Attenuators 47L and 47R, which in most cases will be ganged together and marked in decibels. The next most important control is the level of ambience extracted from the front to the surround channels, via the Attenuators 21A and 21B, also usually ganged together. The user then operates the bypass controls to compare sound with and without the effect, and readjusts the ambience levels until they sound "good". Since the present invention is software-driven, a single virtual or physical control may simultaneously change the state of several switches or gains, or the wordlength of the dithering. Since the process is software-driven, the control software may be altered to make some of the controls in the figures fixed or user-variable, depending on how the embodiment is being used. A custom control software may be created for unique embodiments.

CONCLUSION, RAMIFICATIONS AND SCOPE

Thus the reader will see that the present invention adds several new tools to the audio production field, filling gaps in the pantheon of current processors.

(a) Restoration of lost ambience and soundstage. Production engineers mastering stereophonic and surround programs often encounter inferior sound recordings. Digital audio recordings which have passed through too many processing stages often arrive at the mastering stage with a narrow soundstage and reduced ambient field. Conventional attempts to increase the ambient field or make the sound "bigger" use artificial reverberators, which are rarely satisfactory, because the reverberator adds reverberation to the entire mixed recording, producing a "muddy" sound. Conventional attempts to increase the stereo soundstage width change the mix, by reducing the ratio of center information to side information. The present invention provides a successful alternative or supplement to these conventional processes.

(b) Forensic analysis. Since the present invention helps increase the intelligibility of center-placed voices, it may be used to stereoize and improve poor field recordings.

(c) Digital Audio Consoles. The present invention may be added to digital audio consoles as an additional processing tool.

(d) Digital Audio Processors. The present invention may be used as a digital audio processor or added to an existing digital audio processor to provide additional functionality. This includes software-driven processors such as "plug-ins" or standalone hardware processors which themselves contain embedded software.

(e) Broadcast. The present invention may be used as or in a broadcast signal processor to enhance sound and/or compensate for losses in the broadcast signal chain.

(f) Motion Pictures and Television production, where the present invention may be used to produce more realistic-sounding dialog, music, and effects.

(g) Internet and Lossy Coding Preprocessing. Lossy data coding processes tend to remove ambience, and reduce stereo width and depth. The present invention may be used to preprocess recordings in order to compensate for anticipated losses due to lossy coding.

(h) Military and Civilian Communications, Telephony. The present invention may be used to enhance the intelligibility and realism of mono dialog, which when enhanced, appears as a "stereoized" image in communication headsets or loudspeakers.

(i) Consumer audio reproduction. The present invention may be used as or in an entertainment device to alter the front depth or surround quality of home or car reproduction.

The present invention may be simplified or altered for economic or other considerations. It can be integrated into a dedicated circuit to be used in unattended operation in a consumer or other reproduction system. Some of the elements in FIG. 2 and FIG. 3 may be rearranged in order, as long as the equations and their derivatives in FIG. 1 are still obeyed.

The following elements may be eliminated for economy or if already provided in an external system:

(a) Block 42A and Gains 42C through 42RS (b) Dither Modules 11C through 11LFE (c) The components associated with dialog surround or mono mode (d) EQs 22A, 22B, 48L and 48R (e) Switch 46

(f) Switch 17, which would have to be replaced by a permanent L-R matrix or stereo pass through (g) any other possible elements that would still permit the basic FIG. 1 equations to remain intact The following elements may be altered for special purposes:

(a) The variable attenuators 26A, 26B, 47L, 47R, 21A, and 21B may be replaced with fixed attenuators in a dedicated installation.

(b) The fixed delay may instead be a computer-determined variable delay for special purposes.

(c) The user-variable attenuators may instead be computer-determined variables for special purposes.

Although the description contains many specificities, these should not be construed as limiting the scope of the invention but as merely providing illustrations of the presently preferred embodiment. The scope of the present invention is such that it may be used anywhere that audio is recorded, mixed, mastered, processed, or auditioned. The appended claims and their legal equivalents precisely define the scope of the present invention.

I claim:

1. A process for enhancing ambience in audio source signals comprising the steps of:

generating a first audio signal;

generating a second audio signal;

delaying and attenuating said second audio signal to form a third audio signal;

summing said third audio signal with said first audio signal to form a fourth audio signal;

delaying and attenuating said first audio signal to form a fifth audio signal;

subtracting said fifth audio signal from said fourth audio signal to form a sixth audio signal;

delaying and attenuating said second audio signal to form a seventh audio signal;

subtracting said seventh audio signal from said sixth audio signal to form an eighth audio signal;

delaying and attenuating said first audio signal to form a ninth audio signal; and summing said eighth audio signal with said ninth audio signal to form an output signal for one channel of a multiple channel audio system for driving a speaker;

whereby the ambience of one channel of an audio system is enhanced.

2. A process for enhancing ambience in audio source signals in accordance with claim 1 including the steps of:

delaying and attenuating said first audio signal to form a tenth audio signal;

subtracting said tenth audio signal from said second audio signal to form an eleventh audio signal;

delaying and attenuating said second audio signal to form a twelfth audio signal;

subtracting said twelfth audio signal from said eleventh audio signal to form an thirteenth audio signal;

delaying and attenuating said first audio signal to form a fourteenth audio signal;

summing said fourteenth audio signal with said thirteenth audio signal to form a fifteenth audio signal;

delaying and attenuating said second audio signal to form a sixteenth audio signal; and summing said sixteenth audio signal with said fifteenth audio signal to form an output signal for a second channel of a multiple channel audio system for driving a speaker;

whereby the ambience of two channels of an audio system are enhanced.

3. A process for enhancing ambience in audio source signals in accordance with claim 2 in which the step of generating a second audio signal includes generating a copy of said first generated audio signal in a monaural audio system.

4. A process for enhancing ambience in audio source signals in accordance with claim 2 including the steps of:

delaying and attenuating said second audio signal to form a seventeenth audio signal;

inverting said seventeenth audio signal to form an eighteenth audio signal;

delaying and attenuating said first audio signal to form a nineteenth audio signal;

summing said eighteenth and nineteenth audio signals to form a twentieth audio signal;

delaying and attenuating said second audio signal to form a twenty first audio signal; and summing said twentieth and twenty first audio signals to form a first surround sound channel audio signal.

5. A process for enhancing ambience in audio source signals in accordance with claim 4 including the steps of:

delaying and attenuating said first audio signal to form a twenty second audio signal;

delaying and attenuating said second audio signal to form a twenty third audio signal;

summing said twenty second and twenty third audio signals to form a twenty fourth audio signal;

delaying and attenuating said first audio signal to form a twenty fifth audio signal; and subtracting said twenty fifth audio signal from said twenty fourth audio signal to form a second surround sound channel audio signal.

6. A process for enhancing ambience in audio source signals in accordance with claim 2 in which the second audio signal is delayed about 30 milliseconds to form the third audio signal.

7. A process for enhancing ambience in audio source signals in accordance with claim 6 in which the first audio signal is delayed about 30 milliseconds to form the tenth audio signal.

8. A process for enhancing ambience in audio source signals in accordance with claim 7 in which the second audio signal is attenuated about 15 decibels to form the third audio signal.

* * * * *